United States Patent [19]

Cywar et al.

[11] Patent Number: 5,352,326
[45] Date of Patent: Oct. 4, 1994

[54] PROCESS FOR MANUFACTURING METALIZED CERAMIC SUBSTRATES

[75] Inventors: Douglas Cywar, Endicott; Don H. Hess, Endwell, both of N.Y.; Christian Lalonde, Brossard, Canada

[73] Assignee: International Business Machines Corporation, Endicott, N.Y.

[21] Appl. No.: 69,304

[22] Filed: May 28, 1993

[51] Int. Cl.$^5$ .................. B44C 1/22; C23F 1/00; B29C 37/00
[52] U.S. Cl. .................. 156/659.1; 156/656; 156/643; 156/904; 430/270; 430/313; 430/318
[58] Field of Search .................. 156/655, 656, 659.1, 156/643, 664, 666, 668, 904; 430/270, 313, 316, 318, 323, 329, 494; 427/510, 555, 558

[56] References Cited

U.S. PATENT DOCUMENTS

| | | | |
|---|---|---|---|
| 3,615,435 | 10/1971 | Chu et al. | 96/28 |
| 3,953,214 | 4/1976 | Lipson et al. | 96/115 |
| 4,014,771 | 3/1977 | Rosenkranz et al. | 204/159.23 |
| 4,100,047 | 7/1978 | McCarty | 204/159.23 |
| 4,157,261 | 6/1979 | Takeda | 96/28 |
| 4,299,910 | 11/1981 | Hung et al. | 430/270 |
| 4,569,901 | 2/1986 | Guillet et al. | 430/270 |
| 4,612,270 | 9/1986 | Pampalone et al. | 430/273 |
| 4,770,739 | 9/1988 | Orvek et al. | 156/904 X |
| 4,935,094 | 6/1990 | Mixon et al. | 156/643 |
| 4,985,343 | 1/1991 | Kushi et al. | 430/285 |

OTHER PUBLICATIONS

"Deep U. V. Hardening of Positive Photoresist Patterns," *Journal of the Electrochemical Society, Accelerated Brief Communications*, Jun. 1982, vol. 129, No. 6, pp. 1379–1381.

*Primary Examiner*—William Powell
*Attorney, Agent, or Firm*—Calfee, Halter, & Griswold

[57] ABSTRACT

The present invention provides a process for rendering acrylic based negative photoresists resistant to hot alkaline permanganate etchant and the iron chloride etchant and for improving the adhesion of the photoresist to the substrate, yet does not require halogenated reagents to develop or strip the photoresist. It has been discovered that the degradation of acrylic based negative photoresists by the permanganate etchant may be overcome by exposing an imaged acrylic based negative photoresist to select wavelengths of actinic radiation either ultraviolet light that is rich in deep UV, about 254 nm wavelength; or infrared radiation from about 2.4 to about 8 microns. Where UV radiation is used, the photoresist is then baked to reduce undercutting of the photoresist. Thereafter, the photoresist is stripped using nonhalocarbon solvents.

19 Claims, 14 Drawing Sheets

PROCESS FOR MANUFACTURING METALIZED CERAMIC SUBSTRATES

BACKGROUND OF THE INVENTION

Conventionally in the manufacturing of metalized ceramic substrates for use as chip carriers, a negative photoresist subtractive circuitization process is employed. The metalization layer is typically a trilayer composed of a 1000 angstrom thick chromium layer, a 5–20 micron thick copper layer, and about a 1000 angstrom chromium layer which is disposed on a ceramic substrate. A negative photoresist, typically a polyisoprene cyclized rubber photoresist such as KTFR manufactured by Shipley Corporation, is applied atop the metalization, exposed, and developed to produce an image. The image is used for subtractive circuitization, in which the trilayer is etched in conveyorized etching equipment to form the surface circuitization; the metal that is not protected by photoresist is removed. First, a 45° C. alkaline permanganate etchant is employed to selectively remove the top layer of chromium. Next, the copper layer is selectively removed by an iron chloride etchant. Next, the bottom layer of chromium is selectively removed by etching a second time with the 45° C. alkaline permanganate etchant. After the etching is completed, the photoresist is stripped leaving a metalized pattern on the ceramic substrate. Portions of the remaining metalization may be removed, using similar procedures, during subsequent manufacturing steps.

The KTFR is a negative photoresist so it is not subject to the narrow processing windows to which positive photoresists are subject. Additionally, the KTFR photoresist can withstand high temperatures and can withstand both the iron chloride etchant and hot alkaline permanganate etchants. However, the KTFR photoresist requires halocarbon solvents, such as methyl chloroform (MCF) and Freon ® to develop and strip the photoresist. Governmental regulations require that the use of such halocarbon solvents be eliminated within the next few years.

Acrylic based negative photoresists can withstand high temperatures and do not require MCF or Freon ® for development. However, they demonstrate poor resistance to the 45° C. alkaline potassium permanganate etchant. Imaged acrylic based negative photoresist degrade within about 15 seconds after coming into contact with the hot permanganate etchant. Also, such acrylic based negative photoresists are frequently undercut by the hot permanganate etchant.

It is desirable to have acrylic based negative photoresist that: can withstand both the iron chloride etchant and the hot alkaline permanganate etchant solutions; that demonstrates minimal undercutting; and that can be both developed and stripped by nonhalogenated reagents.

SUMMARY OF THE INVENTION

The present invention provides a process for rendering acrylic based negative photoresists resistant to hot alkaline permanganate etchant and for reducing the undercutting of the photoresist, yet does not require halogenated reagents to develop or strip the photoresist. It has been discovered that the degradation of acrylic based negative photoresists by the permanganate etchant may be overcome by exposing an imaged, developed, acrylic based negative photoresist to selected wavelengths of actinic radiation. It has also been discovered that a subsequent baking step reduces the undercutting of the photoresist by improving the adhesion of the photoresist to the metal surface of the substrate. Thereafter, the photoresist is stripped using solvents that are free or essentially free of halocarbons.

DETAILED DESCRIPTION OF THE INVENTION

Figure 1:
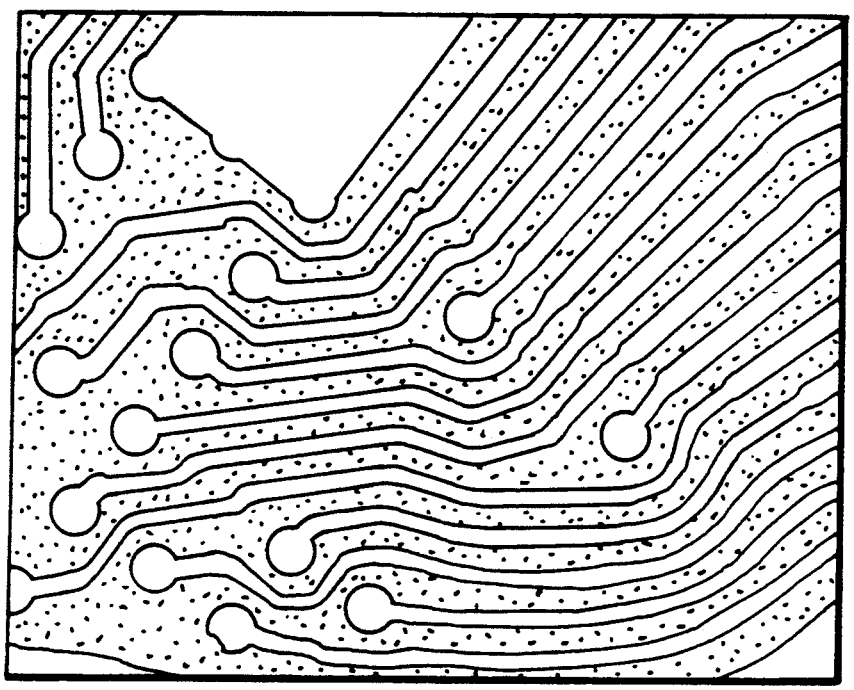
FIG. 1 is a drawing representing 40× magnification of a NT90 photoresist coated part subjected to a UV bump, followed by a 35 second etch of the top chromium layer.

The present invention provides a method for rendering acrylic based negative photoresists resistant to hot alkaline permanganate etchant, referred to herein as the permanganate etchant, and for improving the adhesion of the photoresist to the substrate, yet does not require halogenated reagents to develop or strip the photoresist. It has been discovered that the degradation of acrylic based negative photoresists by the hot permanganate etchant may be overcome, according to one embodiment of the invention, by exposing an imaged, developed, acrylic based negative photoresist to ultraviolet light that is rich in deep UV, that is about 200 nm to about 310 nm, preferably, about 254 nm, wavelength radiation. This exposure to the deep ultraviolet light, also referred to herein as a "UV bump", substantially further cures the photoresist to provide about 15% to 30% residual ethylenic unsaturation, that is, to provide about 70–85% curing.

It has also been discovered that a subsequent convection oven or infrared oven baking step improves the adhesion of the photoresist to the metal surface of the substrate, thereby reducing the undercutting of the photoresist.

Alternatively, according to another embodiment of the invention, the imaged, developed, photoresist may be exposed to infrared radiation having wavelengths from about 2.4 to about 8 microns, instead of receiving a UV bump.

Thereafter, the photoresist is stripped using solvents that are free or essentially free of halocarbons.

While in the past, positive Novolak photoresists have been exposed to deep UV, to assist in maintaining line resolution, particularly edge profile and line dimensions, during 180° C. 30 minute oven bakes, such UV exposure resulted in a hardening or a curing of only the outermost layer of the photoresist. This hardened thin layer provided a rigid "shell" that confined the interior photoresist and prevented it from flowing and spreading. The deep UV exposure of positive photoresist was not proposed as a method for rendering the positive photoresist resistant to etchant much less alkaline potassium permanganate etchant. Indeed, once the positive photoresist was exposed to the deep UV and baked, it could not be stripped using aqueous concentrated base stripping agents.

The Photoresist

Acrylic based negative photoresist suitable for use in this invention include, for example a photoresist containing: multifunctional (containing more than 1 functional acrylic group) acrylic monomer; and terpolymers of 2-dimethylaminoethyl methacrylate, ethyl methacrylate, and methyl methacrylate; available as aqueous emulsion under the trademark Shipley Eagle ® or as an in an organic solvent under the tradename Shipley Photoposit ® NT90 from Shipley in Newton, Mass. The photoresist may be applied in a conventional manner including, for example, spray coating for the Shipley NT90 or electrodeposition for the Shipley Eagle ®. To achieve a suitable viscosity for spray coating, the photoresist is typically thinned using a solvent such as Hisol 15 from Ashland Chemical Company. The pendant tertiary amino groups of such photoresists enable the photoresist to be developed using aqueous solutions that contain organic accids such as lactic acid.

The photoresist also contains a conventional free radical initiator such as Irgacure 907 from Ciba Geigy, and typically, a conventional photosensitizer such as isopropylthioxanthone. The photoresist may also contain a solvent such as, for example, propylene glycol methyl ether. The photoresist can withstand etchants such as, for example the iron chloride and copper chloride.

PROCESS

The photoresist is applied to the metalization layer using conventional application methods, such as spray coating or electrodeposition. The photoresist is then conventionally imaged by exposing the photoresist to, for example, 100 m J/cm² UV light using a phototool. In this initial exposure, the UV light must contain wavelengths required to activate the photoinititators. The NT90 photoresist requires wavelength of primarily about 365 nm. Next, the photoresist is developed using a non-halogenated, preferably water based, developing solvent such as Eagle 2005 from Shipley, which contains lactic acid and surfactants. The developing solution removes the portions of the photoresist that were not exposed to the UV light thereby creating a patterned photoresist. Next, the photoresist is exposed to from about 0.3 to about 10 J/cm², preferably about 0.6 J/cm², of deep UV light, not using a phototool. The wavelength of light is measured by an UVCURE radiometer model M254, from Electronic Instrumentation & Technologies, Inc., using the probe with the maximum sensitivity set at 254 nm. During the bump the photoresist is preferably maintained at a temperature below about 80° C. A Lesco UV curing system, containing an electrodeless, microwave excited, medium pressure lamp was used. The lamp, available under the designation "H" lamp from Fusion Systems, is rich in 200–300 nm wavelengths. The lamp is reciprocating, and moves in a direction parallel to the conveyor motion. The lamp is in focus 4 inches above the conveyor and the reciprocator speed is 40 strokes/minute.

Thereafter, the photoresist is baked using either a convection oven or an IR oven. The baking is accomplished in a conventional convection oven at 90°–170° C., preferably 130° C., for at least 10 minutes, preferably 30 minutes. Preferably, the baking is accomplished by exposure to infrared radiation, which requires less time than the convection oven bake. A custom made IR conveyorized system manufactured by Lesco, Inc. was used for the IR-bakes. The unit consists of a series of medium wavelength IR elements spaced about one inch apart and 4 inches above the conveyor. Using a Lesco infrared conveyorized system, the infrared radiation exposure may be accomplished in 1 to 10 minutes at a temperature of 90°–300° C. Preferably the total exposure time is about 5 minutes; first the substrate temperature is maintained at 125° C. for 1.67 minutes, followed by 157° C. for 1.67 minutes, followed by 190° C. for 1.67 minutes. One could of course vary the settings as desired. Preferably the infrared elements provide medium wavelengths from 2.4 to 8 microns. The minimum part temperature is about 90° C. Of course other infrared systems may be used; the conditions would be adjusted accordingly.

Alternatively, instead of exposing the photoresist to the deep UV, followed by the baking step, the imaged, developed, photoresist may be exposed solely to infrared radiation having wavelengths of from about 2.4 to about 8 microns. However, such procedure requires a longer time than the time needed for a UV bump followed by the IR bake. Using the Lesco IR system, the exposure time is from about 7 to 20 minutes at temperatures of 150°–200° C., preferably 12 minutes at a temperature of 170° C. The minimum part temperature is about 150° C.

After subtractive circuitization, that is etching, the photoresist is stripped by successive treatments with an aqueous alkaline solution containing a mixture of water soluble organic solvents, preferably biodegradable, water rinseable solvents, such as "ACT 140" available from Advanced Chemical Technologies, Allentown, Pa., deionized water, and isopropyl alcohol. The ACT is composed of 10% KOH, water, alcohols, and glycol ethers; it does not contain halocarbon solvents.

EVALUATION OF THE PHOTORESIST

The Shipley NT90 photoresist was first spray coated onto "parts" which are metalized ceramic substrates composed of about a 1000 angstrom thick chromium layer, about an 8 micron thick copper layer, and about a 1000 angstrom chromium layer disposed on a ceramic substrate. The photoresist was imaged through a conventional phototool which has a 1.5 mil line thickness, unless otherwise noted, and spray developed using Shipley Eagle 2005 developer. These parts were used to evaluate the resistance of the photoresist to the permanganate etchant and the extent of undercutting of the photoresist. To evaluate the extent of curing of the photoresist, photoresist was spin coated on NaCl windows from Optovac, N. Brookfield, Mass.

Example 1A: UV bump and convection oven bake

The imaged, developed Shipley NT90 photoresist coated parts were exposed to various dosages of UV, rich in 200–310 nm wavelength radiation, using the equipment described in the processing section. The photoresist was then baked in a convection oven at 130° C. for 30 minutes. The results are in Table V.

Example 1B: UV bump and convection oven bake

The imaged, developed Shipley NT90 photoresist coated parts were exposed to 0.6 J/cm$^2$ UV bump then baked for 30 minutes in a convection oven at 70°, 90°, 110°, 130°, 150° or 170° C. The results are in Table IV B.

Example 2: UV bump and IR oven bake

The imaged, developed Shipley NT90 photoresist coated parts were exposed as in Example 1 to either 1, 2 or 3 J/cm$^2$ UV bump and then baked using infrared radiation for various times at various IR temperatures, as indicated in Tables I and II.

Example 3: IR oven bake

The imaged, developed Shipley NT90 photoresist coated part was not exposed to UV bump as in Example 1 but baked using IR radiation for 1, 2.5 or 5 minutes at various IR temperatures, as indicated in Table III B.

Example 4: UV Bump No Bake

Figure 2:
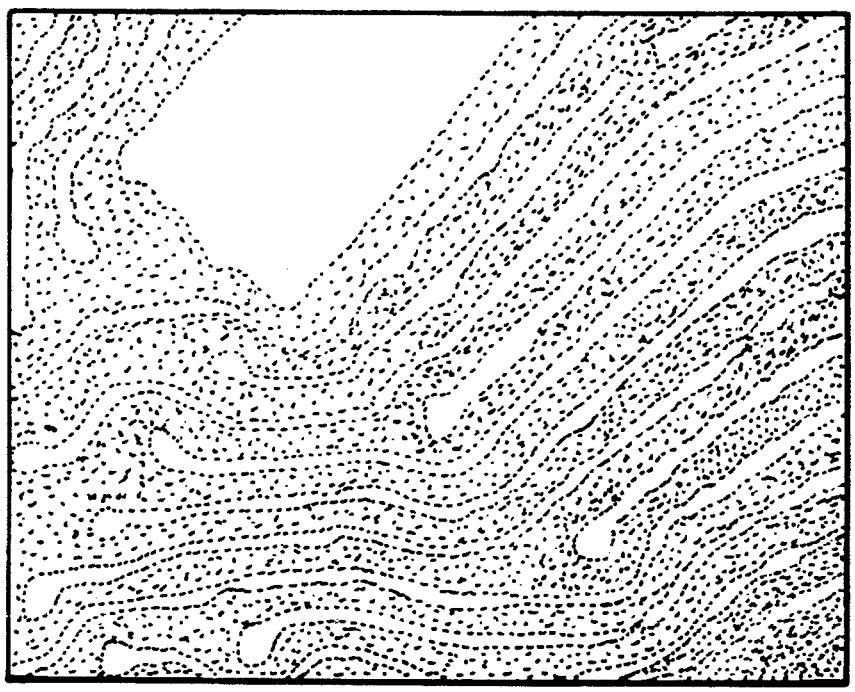
FIG. 2 is a drawing representing 40× magnification of a NT90 photoresist coated part subjected to a UV bump, followed by a 70 second etch of the top chromium layer.

The imaged, developed NT90 coated parts were exposed to 1 J UV radiation, as in Example 1. The part is shown in FIGS. 1 and 2.

Comparative Examples

Example A

The imaged developed NT90 coated parts were exposed to UV light primarily in the 360 nm region at exposure doses of 0.3, 0.6, 1, 2, 3, 5, and 10 J/cm$^2$. The results are shown in Table V.

Example B

The imaged developed NT90 coated parts were exposed to conventional convection oven baking, without the UV bump, for 30 minutes at bake temperatures of 100°, 150°, 170°, 190° and 210° C. The results are summarized in Table VI.

Example C

Figure 6:
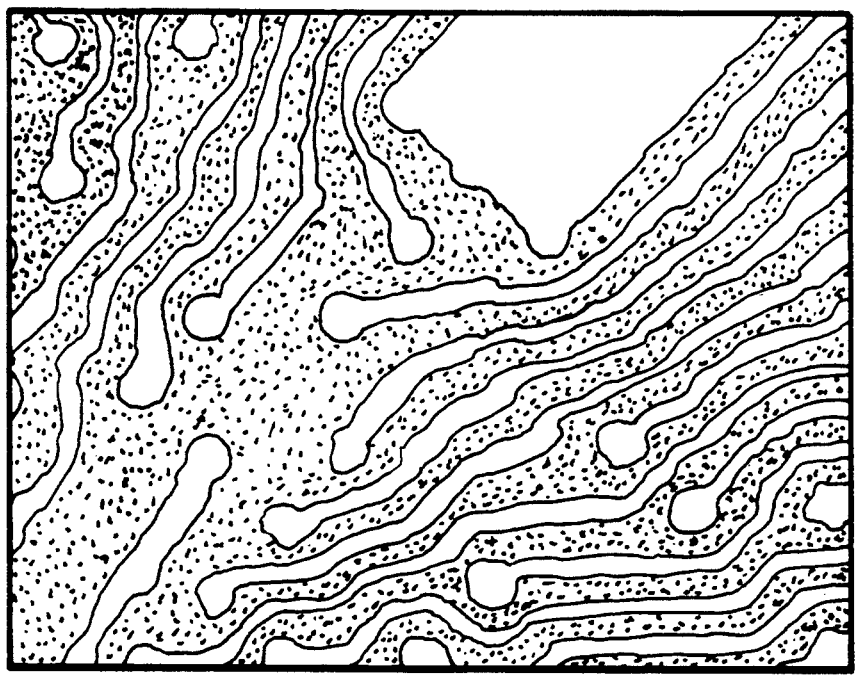
FIG. 6 is a drawing representing 40× magnification of a NT90 photoresist coated part subjected to a bake then a UV bump, followed by a 35 second etch of the top chromium layer.
Figure 7:
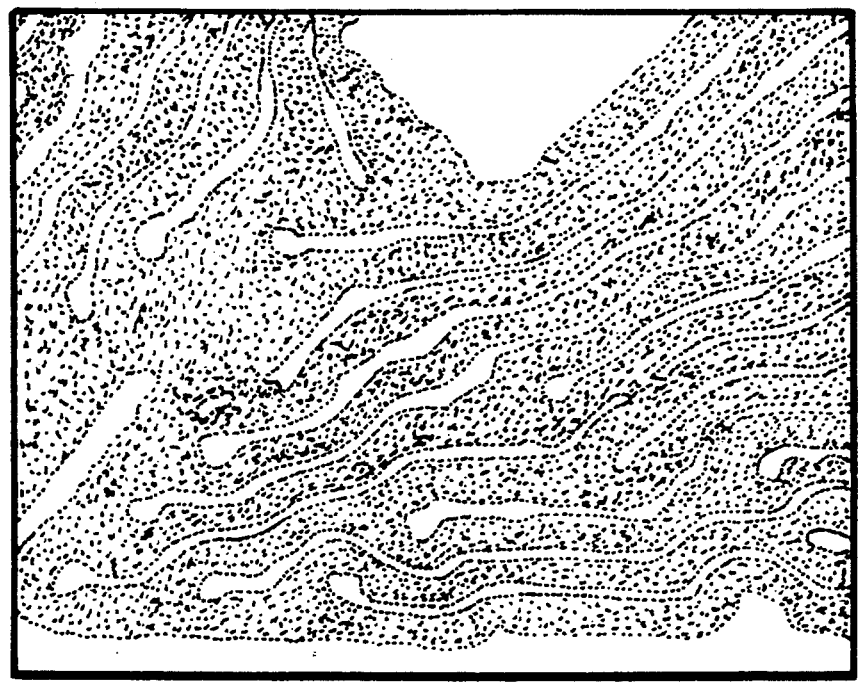
FIG. 7 is a drawing representing 40× magnification of a NT90 photoresist coated part subjected to a bake, then a UV bump, followed by a 70 second etch of the top chromium layer.

The imaged developed NT90 coated part was first baked at 150° C. for 30 minutes in a convection oven, then exposed to 1 J/cm$^2$ UV light rich in 200–310 nm wavelengths. The results are shown in FIGS. 6 and 7.

Example D

The imaged developed NT90 coated parts were not subjected to either a UV bump, or any bake step. The results are shown in Table I.

The imaged photoresists produced according to the above examples were then evaluated for resistance to degradation by the hot permanganate etchant, and also evaluated for undercutting.

The parts from comparative Example A in which the photoresist was exposed to primarily 360 nm, rather than 254 nm, wavelength radiation was not rendered resistant to the hot permanganate etchant; even after a 10 J/cm$^2$ exposure dose the photoresist was readily attacked by the permanganate etchant. Similarly, the photoresist on parts from comparative Example B that were only baked in a convection oven did not withstand the permanganate etchant; within 15 seconds of immersion the photoresist had turned black and peeled off. While parts that were convection baked at 190° and 200° C. resisted the permanganate etchant, they were not strippable with the stripper according to the present invention.

In comparison, all the methods, which involved UV bumps, rendered the photoresist resistant to the permanganate etchant. That is, no gross damage to the photoresist was visible after 70 seconds total immersion in the etchant, although some discoloration occurred. However, close inspection of the parts revealed differences among the parts. Several categories of parts were used to evaluate the ability of the photoresist to withstand the permanganate etchant: parts that were exposed to a 1 J/cm$^2$ UV bump, parts that were convection oven baked for 30 minutes at 150° C.; parts that were convection baked at 150° C. for 30 minutes, then exposed to a 1 J/cm$^2$ UV bump; and parts that were exposed to 1

J/cm² UV bump followed by a convection bake at 150° C. for 30 minutes. The parts were immersed in 40° C. permanganate etchant for 35 seconds and microscope photographs were taken. The parts were then further immersed for 35 seconds in permanganate etchant and additional microscope photographs were taken.

Figure 3:
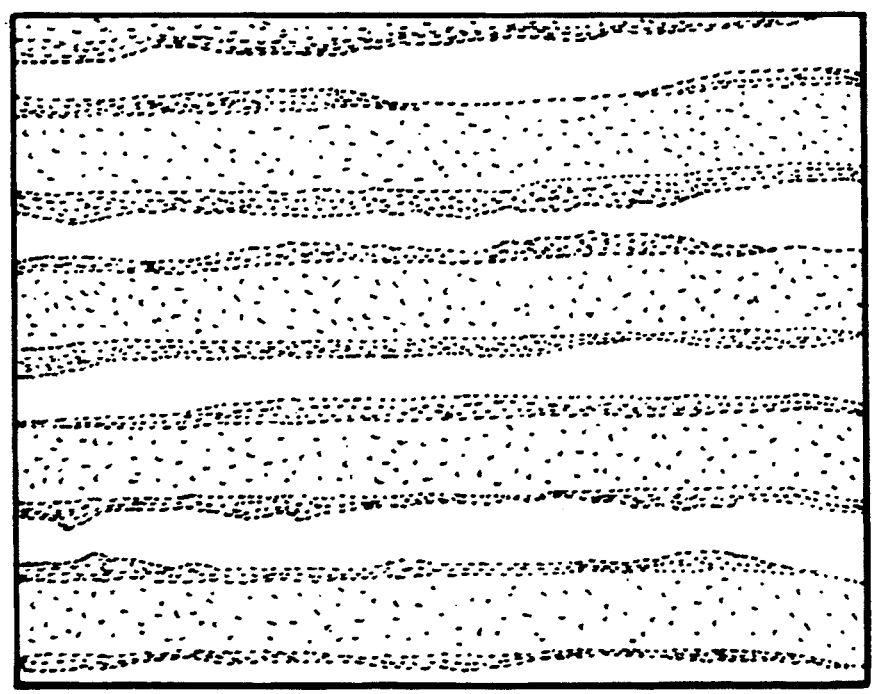
FIG. 3 is a drawing representing 250× magnification of a NT90 photoresist coated part subjected to a UV bump, followed by a 70 second etch of the top chromium layer.
Figure 4:
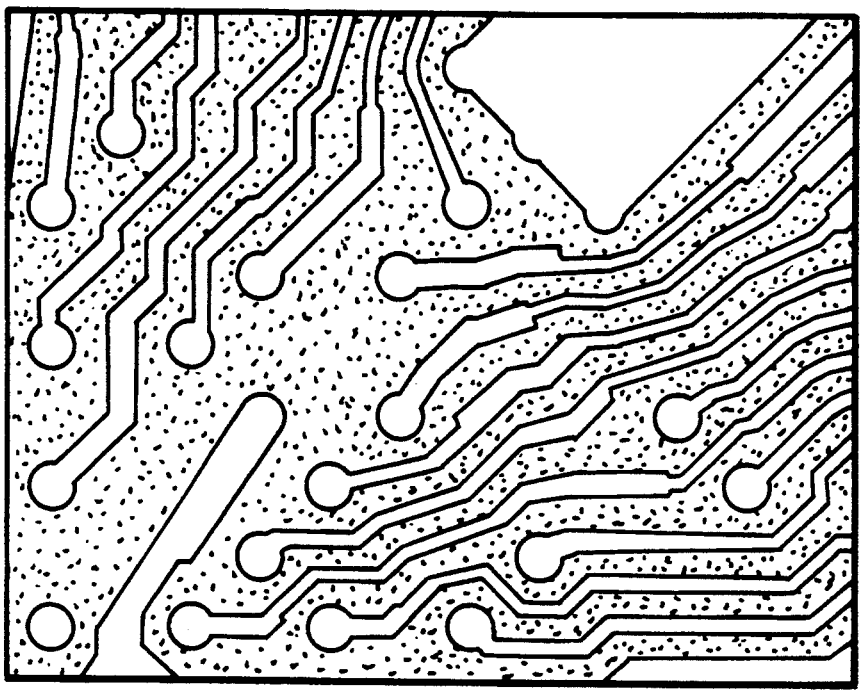
FIG. 4 is a drawing representing 40× magnification of a NT90 photoresist coated part subjected to a UV bump, then baked, followed by a 35 second etch of the top chromium layer.
Figure 5:
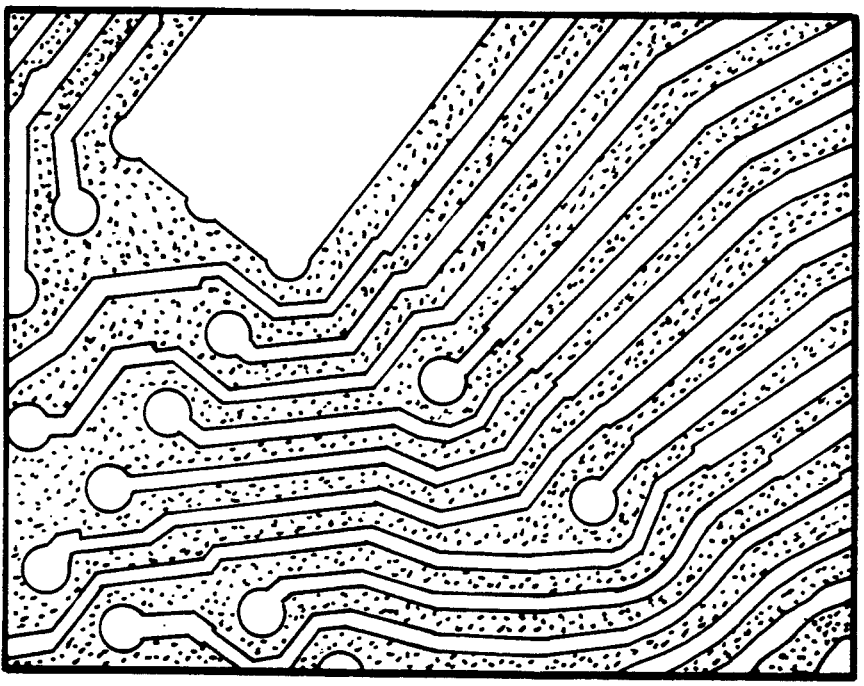
FIG. 5 is a drawing representing 40× magnification of a NT90 photoresist coated part subjected to a UV bump, then baked, followed by a 70 second etch of the top chromium layer.

FIG. 1 shows a microscope photograph at 40× magnification of a UV-bumped part after a 35 second etch, and FIG. 2 shows the same part after a 70 second etch. While the photoresist in FIG. 2 looks like it has degraded, that is, has been attacked by the permanganate etchant, upon higher magnification, as shown in FIG. 3, the photoresist lines are well defined and quite sharp; no degradation has occurred,. Instead, the etchant apparently leaked under the photoresist to attack the underlying chromium thereby undercutting the photoresist image; this produces a wavy, half eaten-away top chromium line. In contrast, FIGS. 4 and 5 show that the photoresist that was UV bumped followed by conventional bake step was not undercut nor attacked by the etchant. FIGS. 6 and 7 show parts that were first baked then UV bumped; the parts exhibit considerable undercutting. Therefore, the bake step is employed after the UV bump to reduce the undercutting. It is believed that during the bake step the photoresist flows to conform to the substrate surface topography to increase the adhesion of the photoresist to the chromium.

Figure 8:
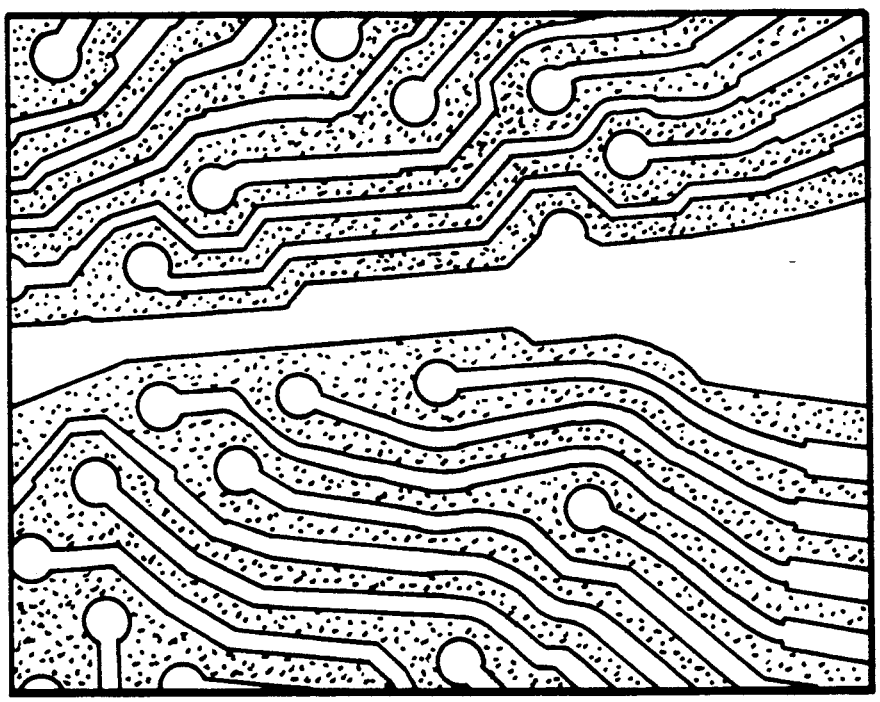
FIG. 8 is a drawing representing 40× magnification of a NT90 photoresist coated part subjected to a UV bump, then an IR bake, followed by sucessive etching of the chromium layer, the copper layer then the second chromium layer.
Figure 9:
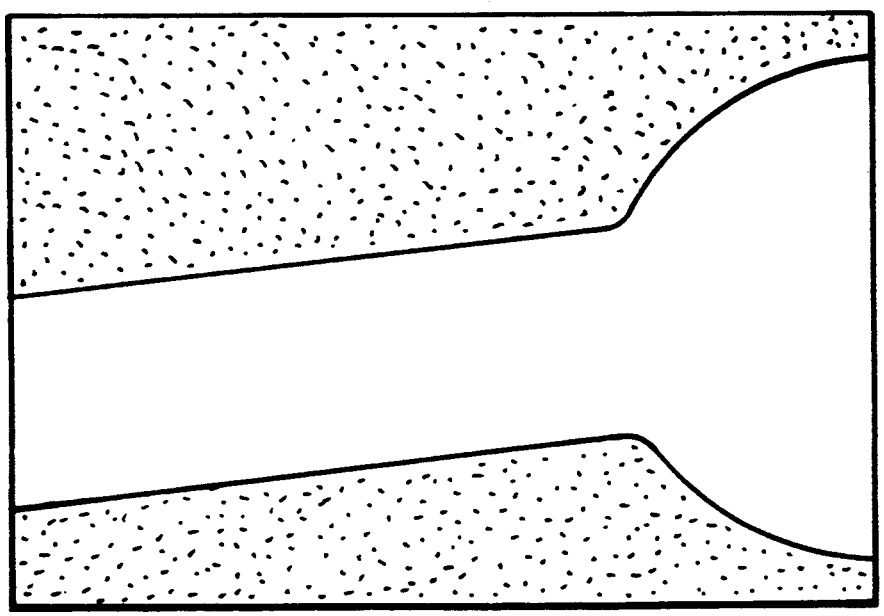
FIG. 9 is a drawing representing 400× magnification of a NT90 photoresist coated part subjected to a UV bump, then an IR bake, followed by sucessive etching of the chromium layer, the copper layer then the second chromium layer.

FIGS. 8 and 9 show the 1.5 mil lines of a part that was UV bumped and then IR baked, and then fully etched first with the permanganate etchant, then the iron chloride etchant, followed by the permanganate etchant. The line edges are well defined with no evidence of the resist being undercut by the permanganate etchant.

Figure 12:
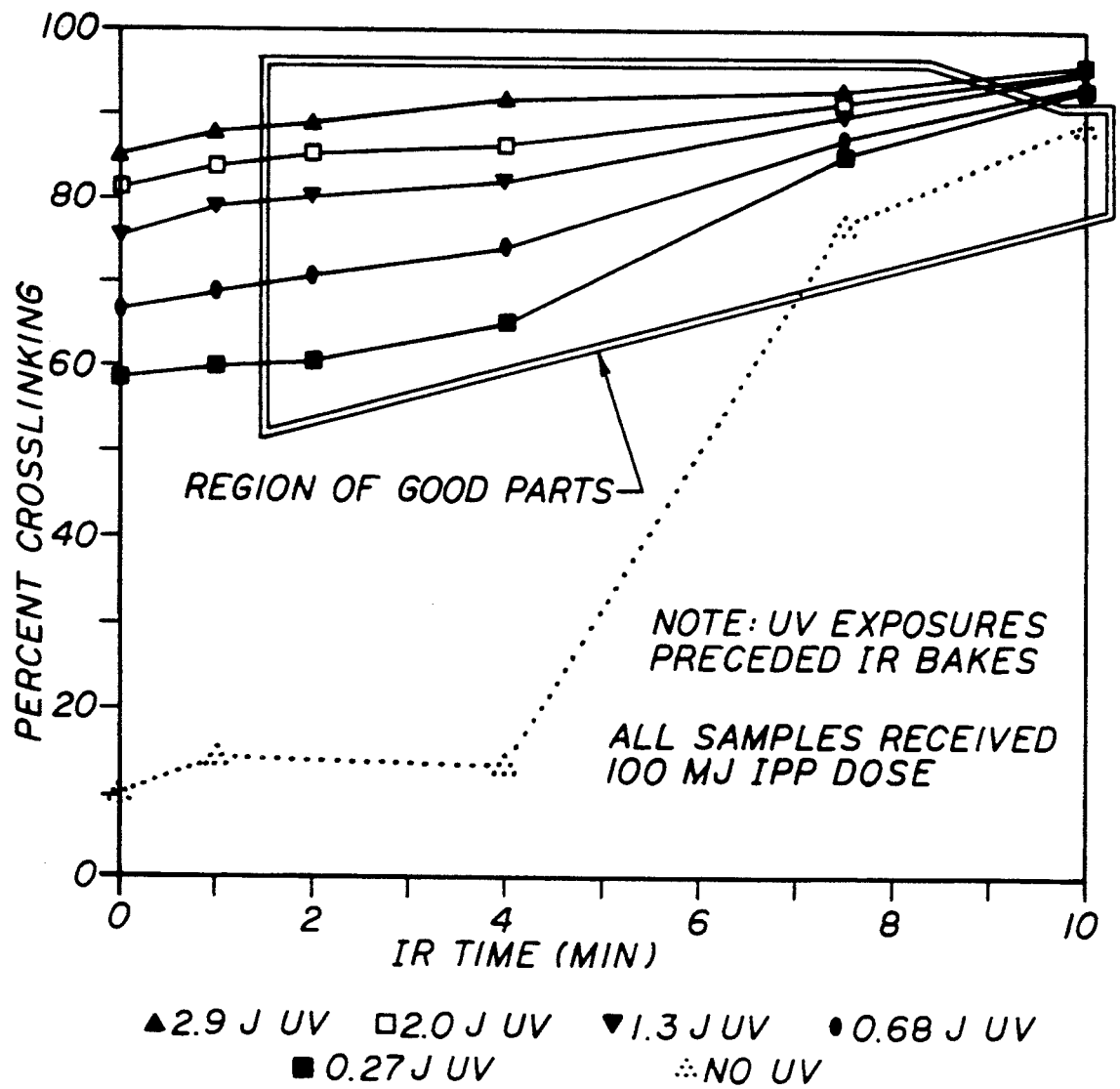
FIG. 12 is a graph showing photoresist curing as a function of UV dose and IR conditions.

The photoresist which received only an IR bake without a UV bump, produced defect free parts, as shown in FIG. 12. However, a relatively long time of 7 to 10 minutes under the IR elements was needed.

In another method for evaluating the photoresist, imaged, developed photoresist coated parts were immersed in the permanganate etchant at 45° C. for 60 seconds, then removed and inspected at 100–200× magnification. Thereafter, each part was etched in a beaker in the iron chloride etchant for 30 seconds, then etched in the permanganate etchant for 60 seconds. The parts were inspected at 100–200× magnification. Parts were determined to be defective if there was copper showing, indicating over-etching of the top chromium layer, or if the entire line was missing, indicating complete etching of both the top chromium layer and the copper layer. The results are summarized in Table I.

TABLE I

| SAMPLE SET | UV energy J/cm² | IR Temperature Zones 1 | 2 | 3 | IR exposure (min.) | Chr 1 | Chr 2 |
| --- | --- | --- | --- | --- | --- | --- | --- |
| 1 | 0 | — | | | 0 | D | D |
| 2 | 1 | — | | | 0 | D | D |
| 3 | 2 | — | | | 0 | D | D |
| 4 | 3 | — | | | 0 | D | D |
| 5 | 1 | 50 | 58 | 60 | 2.5 | A | D |
| 6 | 2 | 50 | 58 | 60 | 2.5 | A | D |
| 7 | 3 | 50 | 58 | 60 | 2.5 | D | D |
| 8 | 1 | 85 | 75 | 68 | 5.0 | A | D |
| 9 | 2 | 85 | 75 | 68 | 5.0 | A | D |
| 10 | 3 | 85 | 75 | 68 | 5.0 | D | D |
| 11 | 1 | 125 | 162 | 184 | 2.5 | A | A |
| 12 | 2 | 125 | 162 | 184 | 2.5 | A | A |
| 13 | 3 | 125 | 162 | 184 | 2.5 | A | A |
| 14 | 1 | 205 | 245 | 250 | 5.0 | A | A |
| 15 | 2 | 205 | 245 | 250 | 5.0 | A | A |
| 16 | 3 | 205 | 245 | 250 | 5.0 | A | A |
| 17 | 1 | 145 | 180 | 190 | 2.5 | A | A |
| 18 | 2 | 145 | 180 | 190 | 2.5 | A | A |
| 19 | 3 | 145 | 180 | 190 | 2.5 | A | A |
| 20 | 1 | 205 | 265 | 300 | 5.0 | A | A |
| 21 | 2 | 205 | 265 | 300 | 5.0 | A | A |
| 22 | 3 | 205 | 265 | 300 | 5.0 | A | A |

D - part defefective due to undercutting
A - part acceptable
Chr 1 - evaluation of top chromium layer after exposure to permanganate etch
Chr 2 - evaluation of bottom chromium layer after exposure to permanganate etch
Each Sample Set contains 1 part In another method of evaluation, the imaged, developed parts were spray etched first with the permanganate etchant, then with the iron chloride etchant, then with the permanganate etchant. The photoresist was then stripped and the parts were examined at a magnification of 60×. The results are summarized in Table II.

TABLE II

| SAMPLE SET | IR Temperatures (°C.) Zone 1 | Zone 2 | Zone 3 | IR TIME (Min) | % DEFECTIVE PARTS |
| --- | --- | --- | --- | --- | --- |
| 1 | <50 | <58 | <60 | 1 | 100 |
| 2 | <60 | <70 | <80 | 1 | 70 |
| 3 | <65 | <79 | <76 | 1 | 100 |
| 4 | <82 | <95 | <90 | 1 | 100 |
| 5 | <85 | <110 | <140 | 1 | 100 |
| 6 | <95 | <140 | <165 | 1 | 100 |
| 7 | <110 | <155 | <165 | 1 | 65 |
| 8 | <125 | <162 | <184 | 1 | 20 |
| 9 | <145 | <175 | <180 | 1 | 10 |
| 10 | <145 | <180 | <190 | 1 | 10 |
| 11 | 50 | 58 | 60 | 2.5 | 35 |
| 12 | 60 | 70 | 80 | 2.5 | 20 |
| 13 | 65 | 79 | 76 | 2.5 | 35 |
| 14 | 82 | 95 | 90 | 2.5 | 15 |
| 15 | 85 | 110 | 140 | 2.5 | 0 |
| 16 | 95 | 140 | 165 | 2.5 | 0 |
| 17 | 110 | 155 | 165 | 2.5 | 0 |
| 18 | 125 | 162 | 184 | 2.5 | 0 |
| 19 | 145 | 175 | 180 | 2.5 | 5 |
| 20 | 145 | 180 | 190 | 2.5 | 0 |
| 21 | 85 | 75 | 68 | 5 | 20 |
| 22 | 80 | 100 | 125 | 5 | 15 |
| 23 | 90 | 133 | 100 | 5 | 10 |
| 24 | 90 | 138 | 185 | 5 | 0 |
| 25 | 125 | 157 | 190 | 5 | 0 |
| 26 | 125 | 177 | 203 | 5 | 0 |
| 27 | 165 | 180 | 200 | 5 | 0 |
| 28 | 205 | 245 | 250 | 5 | 0 |
| 29 | 205 | 277 | 285 | 5 | 0 |
| 30 | 205 | 300 | 300 | 5 | 0 |

All parts received 1 J/cm² UV energy
Above 205, 265, 300° C., the IR tool started to "smoke;" the photoresist on the substrate started to burn.
The temperatures were determined based on correlation between controller settings and previously measured peak part temperatures
Defective parts exhibited undercutting
Each sample set contains 20 parts Table II shows that to achieve 100% acceptable parts for a 2.5 minute time in the IR oven, a temperature of at least 85°, 110° and 140° C., for each of the three zones respectively, is required. This does not take loading effects into account.

The linewidth, that is, the bottom width of the metal lines that were produced after etching, was evaluated for parts exposed to various IR temperatures, and for parts exposed to various convection oven temperatures. Linewidth is an indicator of the extent of undercutting and initial resist linewidth. The results are summarized in the tables below.

TABLE III A

Results of Linewidth Study for IR Tool

| IR temperatures | | | LINEWIDTH (mils) | |
|---|---|---|---|---|
| Zone 1 | Zone 2 | Zone 3 | average | SD |
| 75/125 | 70/148 | 65/154 | chrome attack | |
| 77.5/152 | 72.5/178 | 67.5/203 | 0.87 | 0.08 |
| 80/205 | 75/245 | 70/250 | 1.06 | 0.05 |
| 82.5/205 | 77.5/245 | 82.5/250 | 1.11 | 0.06 |
| 85/210 | 80/310 | 75/329 | 1.13 | 0.11 |

Parts were exposed to 1 J/cm² UV bump
Bake time was 5 minutes

TABLE III B

Parts Receiving IR bake without UV bump.

| SAMPLE SET | IR-TIME | IR-TEMPERATURE °C. | RESULT |
|---|---|---|---|
| 1 | 1 | 55° C. | D |
| 2 | 2 | 105° C. | D |
| 3 | 2 | 145° C. | D |
| 4 | 2 | 154° C. | D |
| 5 | 2 | 290° C. | A |
| 6 | 5 | 145° C. | D |
| 7 | 5 | 215° C. | A |
| 8 | 5 | 415° C. | D* |

*Resist vaporized
D - Defective
A - Acceptable
IR - a single zone, non-conveyorized unit was used
Each Sample Set contained 20 parts.

TABLE IV A

Results of Linewidth Study for Convection Oven

| Bake Temperature (°C.) | Linewidth Average (mils) | SD |
|---|---|---|
| 70 | chrome attack | |
| 90 | 0.85 | 0.12 |
| 110 | 0.96 | 0.07 |
| 130 | 0.90 | 0.07 |
| 140 | 1.03 | 0.05 |
| 150 | 1.11 | 0.06 |
| 160 | 1.19 | 0.06 |
| 170 | 1.23 | 0.07 |

Parts were exposed to 1 J/cm² UV bump
Each Sample Set contained 200 parts
Bake time - 25 minutes
Phototool space-1.50 mil wide As expected, the linewidth increased with increasing temperatures; it is believed that at the increased temperatures the photoresist flows more than at lower temperatures. The more the photoresist flows, the wider the resist line and the more it conforms to surface topography, providing better adhesion to the surface of the chromium and thus limiting undercut by the etchants.

TABLE IV B

Parts Receiving UV bump followed by 30 minute Convection Oven bake

| SAMPLE SET | UV-DOSE | BAKE-TEMPERATURE | % DEFECTIVE PARTS |
|---|---|---|---|
| 1 | 0.6 J/cm² | 70° C. | 50% |
| 2 | 0.6 J/cm² | 90° C. | 30% |
| 3 | 0.6 J/cm² | 110° C. | 0% |
| 4 | 0.6 J/cm² | 130° C. | 0% |
| 5 | 0.6 J/cm² | 150° C. | 0% |
| 6 | 0.6 J/cm² | 170° C. | resist blistered |

Each Sample Set contained 20 parts.

TABLE V

Comparison of deep UV (200–300 nm) bump to near UV (320–450 nm) bump

| UV BUMP DOSE (J/cm²) | EVALUATION |
|---|---|
| Deep UV (Ex. 1A) | |
| 0.06 | 4 |
| 0.12 | 4 |
| 0.20 | 4 |
| 0.30 | 2 |
| 0.30 | 3 |
| 0.40 | 4 |
| 0.60 | 1 |
| 0.60 | 1 |
| 1.0 | 1 |
| 1.0 | 1 |
| 2.0 | 1 |
| 2.0 | 1 |
| 3.0 | 1 |
| 3.0 | 1 |
| 5.0 | 1 |
| 5.0 | 1 |
| 10 | 1 |
| 10 | 1 |
| Near UV (Ex. A) | |
| 0.30 | 4 |
| 0.30 | 4 |
| 0.60 | 4 |
| 0.60 | 4 |
| 1.0 | 4 |
| 1.0 | 4 |
| 2.0 | 4 |
| 2.0 | 4 |
| 3.0 | 4 |
| 3.0 | 4 |
| 5.0 | 3 |
| 5.0 | 3 |
| 10.0 | 3 |
| 10.0 | 4 |

4 - Massive amount of top chromium layer etched and/or lines missing.
3 - significant amount of top chromium layer etched.
2 - minor amount of top chromium layer etched in same areas.
1 - defect free.
After UV bumps, parts were convection oven baked at 130° C. for 30 minutes.

TABLE VI 30 minute convection oven bake without UV bump.

| SAMPLE SET | BAKE TEMPERATURE | % DEFECTIVE PARTS |
|---|---|---|
| 1 | 100° C. | 100% |
| 2 | 150° C. | 100% |
| 3 | 170° C. | 35% |
| 4 | 190° C. | 0% |
| 5 | 210° C. | 0% |

Sample Sets 4 and 5 were unstrippable.
Each Sample Set contained 20 parts.
parts spray etched with permanganate etchant, iron chloride ethcant and permanganate etchant.

Evaluation of the Extent of Curing of the Photoresist

Figure 10:
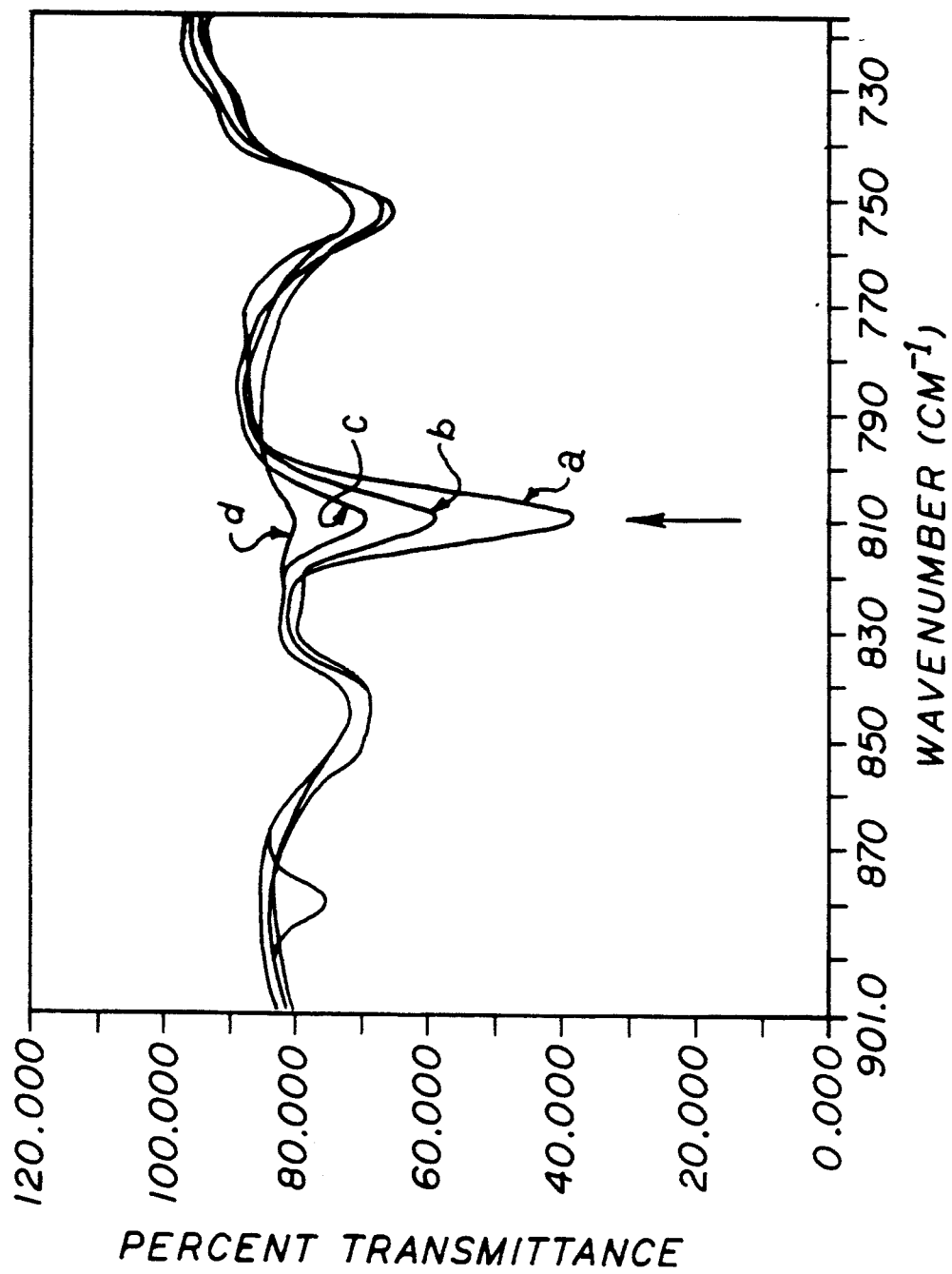
FIG. 10 is an FTIR spectra showing the 810 cm$^{-1}$ peak for NT90 photoresist exhibiting: (a) 0% curing unexposed photoresist, (b) 59% curing (c) 75% curing, and (d) 96% curing.

The UV bump serves to cure, that is, reduce the unsaturation or amount of acrylic double bonds of the photoresist. Curing substantially increases the resistance of the photoresist to the permanganate etchant. Fourier Transform Infrared spectroscopy (FTIR) was used to quantify the degree of residual unsaturation, that is residual acrylic double bonds, of photoresist coated on NaCl windows. The NT90 photoresist was permitted to evaporate to provide a more viscous photoresist and then was applied by spin coating onto the NaCl windows which were then subject to a 10 minute, 100° C. bake to remove solvents. The NaCl windows had a photoresist coating thickness of 10 μm. For parts and NaCl windows that received an IR bake, for bake times of 2.5 minutes, infrared temperatures of 205°, 245° and 250° C. were used. The percent of cure, also expressed as 100−(minus) percent residual unsaturation, was calculated from the area of the 810 cm$^{-1}$ peak, characteristic of the acrylic double bond. FIG. 10 is an FTIR spectra showing the 810 cm$^{-1}$ peak for NT90 photoresist which exhibits: (a) 0% curing, in the unexposed photoresist, (b) 59% curing, (c) 75% curing, and (d) 96% curing. The percent residual unsaturation of the photoresist was calculated as follows:

percent residual unsaturation=(A/A')×100 where A=area of 810 cm$^{-1}$ peak and, A'=area of 810 cm$^{-1}$ peak for unexposed photoresist.

A value of 3.99 for A' was obtained by measurement of samples not exposed to UV light. Generally, a single sample gave a 2.0% relative standard deviation (RSD) in peak area, while the RSD for identically processed samples was 4.4%. The percentage of cure values are within ±0.8 due to random error with 95% confidence, for results in the range of 50% to 100% of cure and about ±5 for cure values in the 0 to 25% range.

The extent of cure for NaCl windows exposed to various UV bump dosages, varying IR times or at varying convection bake times and temperatures are summarized in Table VII.

TABLE VII

| NO. | UV ENERGY (J/cm$^2$) | IR TIME (min) | 30 MIN BAKE (°C.) | AREA 810 CM$^{-1}$ PEAK | % CURE |
|---|---|---|---|---|---|
| 09 | 0.271 | — | — | 1.651 | 58.6 |
| 10 | 0.679 | — | — | 1.327 | 66.7 |
| 11a | 1.29 | — | — | 1.034 | 74.1 |
| 11b | 1.29 | — | — | 0.957 | 76.0 |
| 11c | 1.29 | — | — | 0.986 | 75.3 |
| 11d | 1.29 | — | — | 0.919 | 77.0 |
| 11e | 1.29 | — | — | 1.007 | 74.8 |
| 12 | 1.97 | — | — | 0.749 | 81.2 |
| 13 | 2.87 | — | — | 0.587 | 85.3 |
| 14a | — | — | 90 | 3.564 | 10.7 |
| 14b | — | — | 90 | 3.546 | 11.1 |
| 15a | — | — | 120 | 3.439 | 13.8 |
| 15b | — | — | 120 | 3.835 | 3.9 |
| 15c | — | — | 120 | 3.391 | 15.0 |
| 15d | — | — | 120 | 3.571 | 10.5 |
| 15e | — | — | 120 | 3.502 | 12.2 |
| 17 | — | — | 170 | 3.330 | 34.0 |
| 18 | — | 1.0 | — | 3.427 | 14.1 |
| 20a | — | 4.0 | — | 3.253 | 18.5 |
| 20b | — | 4.0 | — | 3.436 | 13.9 |
| 20c | — | 4.0 | — | 3.283 | 17.7 |
| 20d | — | 4.0 | — | 3.483 | 12.7 |
| 20e | — | 4.0 | — | 3.863 | 3.2 |
| 21 | — | 7.5 | — | 0.921 | 16.9 |
| 22 | — | 10.0 | — | 0.440 | 89.0 |
| 23 | 0.271 | 1.0 | — | 1.601 | 59.9 |
| 24 | 0.271 | 2.0 | — | 1.578 | 60.5 |
| 25 | 0.271 | 4.0 | — | 1.392 | 65.1 |
| 26 | 0.271 | 7.5 | — | 0.595 | 85.1 |
| 27 | 0.271 | 10.0 | — | 0.281 | 93.0 |
| 28 | 0.679 | 1.0 | — | 1.243 | 68.8 |
| 29 | 0.679 | 2.0 | — | 1.170 | 70.7 |
| 30a | 0.679 | 4.0 | — | 0.941 | 76.4 |
| 30b | 0.679 | 4.0 | — | 1.042 | 73.9 |
| 30c | 0.679 | 4.0 | — | 0.986 | 75.3 |
| 30d | 0.679 | 4.0 | — | 1.046 | 73.8 |
| 31 | 0.679 | 7.5 | — | 0.520 | 87.0 |
| 32 | 0.679 | 10.0 | — | 0.273 | 93.2 |
| 33 | 1.29 | 1.0 | — | 0.838 | 79.0 |
| 34 | 1.29 | 2.0 | — | 0.790 | 80.2 |
| 35 | 1.29 | 4.0 | — | 0.722 | 81.9 |
| 36 | 1.29 | 7.5 | — | 0.415 | 89.6 |
| 37 | 1.29 | 10.0 | — | 0.227 | 94.8 |
| 38 | 1.97 | 1.0 | — | 0.644 | 83.9 |
| 39 | 1.97 | 2.0 | — | 0.588 | 85.3 |
| 40 | 1.97 | 4.0 | — | 0.550 | 86.2 |
| 42 | 1.97 | 10.0 | — | 0.212 | 94.7 |
| 43 | 2.87 | 1.0 | — | 0.480 | 88.0 |
| 44 | 2.87 | 2.0 | — | 0.438 | 89.0 |
| 45 | 2.87 | 4.0 | — | 0.332 | 91.7 |
| 46 | 2.87 | 7.5 | — | 0.297 | 92.6 |
| 47 | 2.87 | 10.0 | — | 0.175 | 95.6 |
| 48 | 0.271 | — | 90 | 0.510 | 62.2 |
| 49 | 0.271 | — | 120 | 1.663 | 58.3 |
| 50 | 0.271 | — | 140 | 1.456 | 63.5 |
| 51 | 0.271 | — | 170 | 1.412 | 64.6 |
| 52 | 0.679 | — | 90 | 1.194 | 70.1 |
| 53 | 0.679 | — | 120 | 1.174 | 70.6 |
| 54a | 0.679 | — | 140 | 1.146 | 71.3 |
| 54b | 0.679 | — | 140 | 1.078 | 73.0 |
| 54c | 0.679 | — | 140 | 1.200 | 69.9 |
| 54d | 0.679 | — | 140 | 1.143 | 71.4 |
| 55 | 0.679 | — | 170 | 1.072 | 73.1 |
| 56 | 1.29 | — | 90 | 0.833 | 79.1 |
| 57 | 1.29 | — | 120 | 0.866 | 78.3 |
| 58 | 1.29 | — | 140 | 0.737 | 81.5 |
| 59 | 1.29 | — | 170 | 0.777 | 80.5 |
| 60 | 1.97 | — | 90 | 0.617 | 84.5 |
| 61 | 1.97 | — | 20 | 0.587 | 85.3 |
| 62 | 1.97 | — | 140 | 0.560 | 86.0 |
| 63 | 1.97 | — | 170 | 0.635 | 84.1 |
| 64 | 2.87 | — | 90 | 0.476 | 88.1 |
| 65 | 2.87 | — | 120 | 0.473 | 88.1 |
| 66 | 2.87 | — | 140 | 0.416 | 89.6 |
| 67 | 2.87 | — | 170 | 0.412 | 89.7 |

*Multiple entries for a single number (e.g., 54a, 54b, 54c) refer to different samples that were identically processed.
IR peak temperatures were determined for 5 minute IR bakes to be 205°, 245° and 250° C., for zones 1, 2, and 3, respectively, for 5 minute IR exposure.

Figure 11:
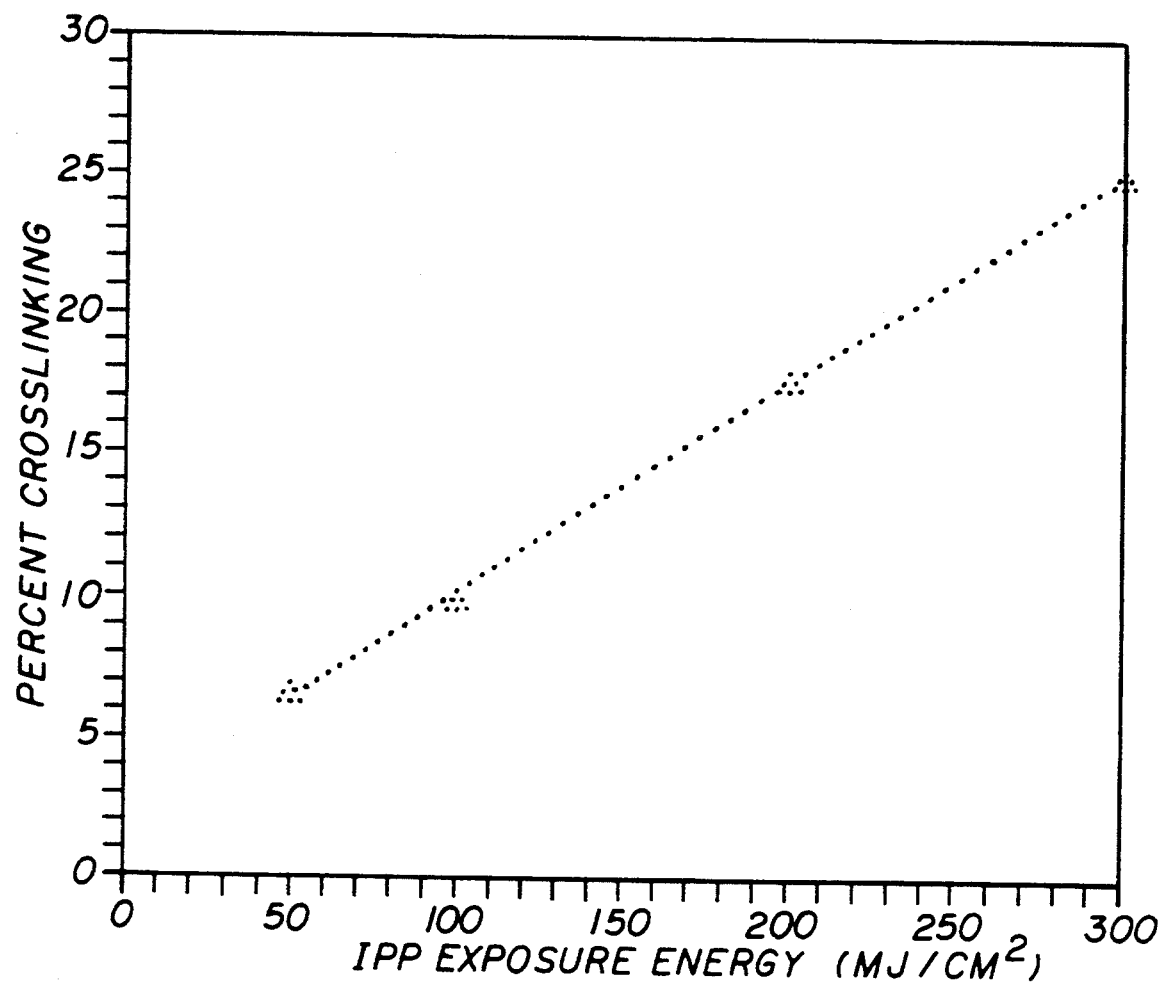
FIG. 11 is a graph showing photoresist curing as a function of imaging exposure dose.

As a preliminary point, the extent of curing that resulted from the initial UV exposure to 320–450 nm wavelength light during the imaging step was determined as shown in FIG. 11. Surprisingly, in the lithographically useful range of 100 to 250 mJ/cm$^2$, the percentage of curing after imaging the photoresist with 100 mJ, was found to be low, from 10 to 20%. Therefore, since 80 to 90% of all acrylic double bonds are left unreacted after the initial UV exposure, only a relatively minor amount of curing is needed to obtain good lithographic properties. Thus, the photoresist can still be further cured after the imaging and development.

Figure 14:
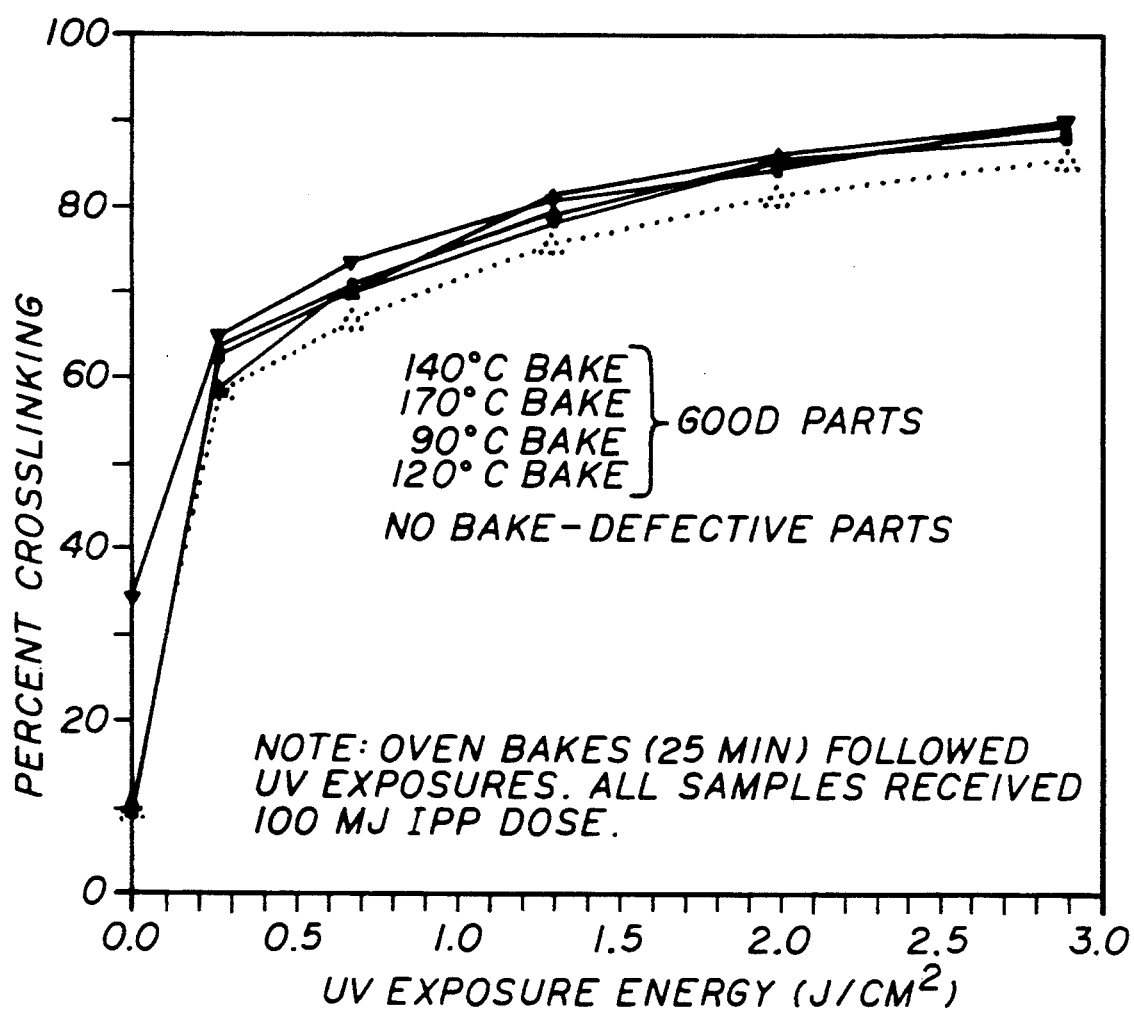
FIG. 14 is a graph of photoresist curing as a function of UV dose and convection oven-bake temperature. The following symbols correspond to the following bake temperature: ▲ :140° C.; ▼:170° C.; ■ :90° C.; ● :120° C.; and ∴ : no bake. Those parts which did not receive any UV bump were defective.

FIG. 14 shows that the deep UV bump, without any bake, increases the extent of curing. A 0.27 J/cm$^2$ bump increases the percent of curing from about 10%, which resulted from the imaging exposure, to about 58%. A higher UV energy bump of 2.87 J/cm$^2$, without any bake, increases the percent of curing to as much as 85%. FIG. 12 shows that an IR bake alone causes curing, although it takes about a 6 minutes for a significant amount, about 45% of curing to occur. Thus, the IR bake alone is slower than the UV bump followed by a 2–3 minute IR bake. In general, a 4 minute IR bake only increased the percent of curing by about 5%.

The percent of curing was correlated to photoresist etchant resistance and degree undercutting by evaluating parts at identical conditions to those for the NaCl windows. The parts were spray etched with the permanganate etchant, followed by the iron chloride etchant, then the permanganate etchant and visually inspected for defects, that is undercutting. As shown in FIG. 12, while parts receiving a 0 or 1 minute IR bake had defects, those receiving a UV bump followed by a 2–6 minute IR bake did not. Interestingly, many of the "acceptable" parts had a much lower percent of curing than the defective parts. For example, acceptable parts that received a 0.27–0.68 J/cm$^2$ bump followed by a 2–4 minute IR bake exhibited 60–70% curing; this is less than the 80–90% of curing exhibited by defective parts which received 2.0–2.9 J bump followed by 0–1 minute bake. Thus, the increased benefit of the bake step is not due to further curing of the photoresist.

FIG. 12 shows a very high percent of curing for samples receiving a UV bump followed by a 10 minute IR bake. However, these conditions produced defective parts; the photoresist was probably degraded under these extreme conditions, although virtually all the acrylic double bonds were reacted. The photoresist films had a very dark appearance and looked "burned".

Convection Oven

Figure 13:
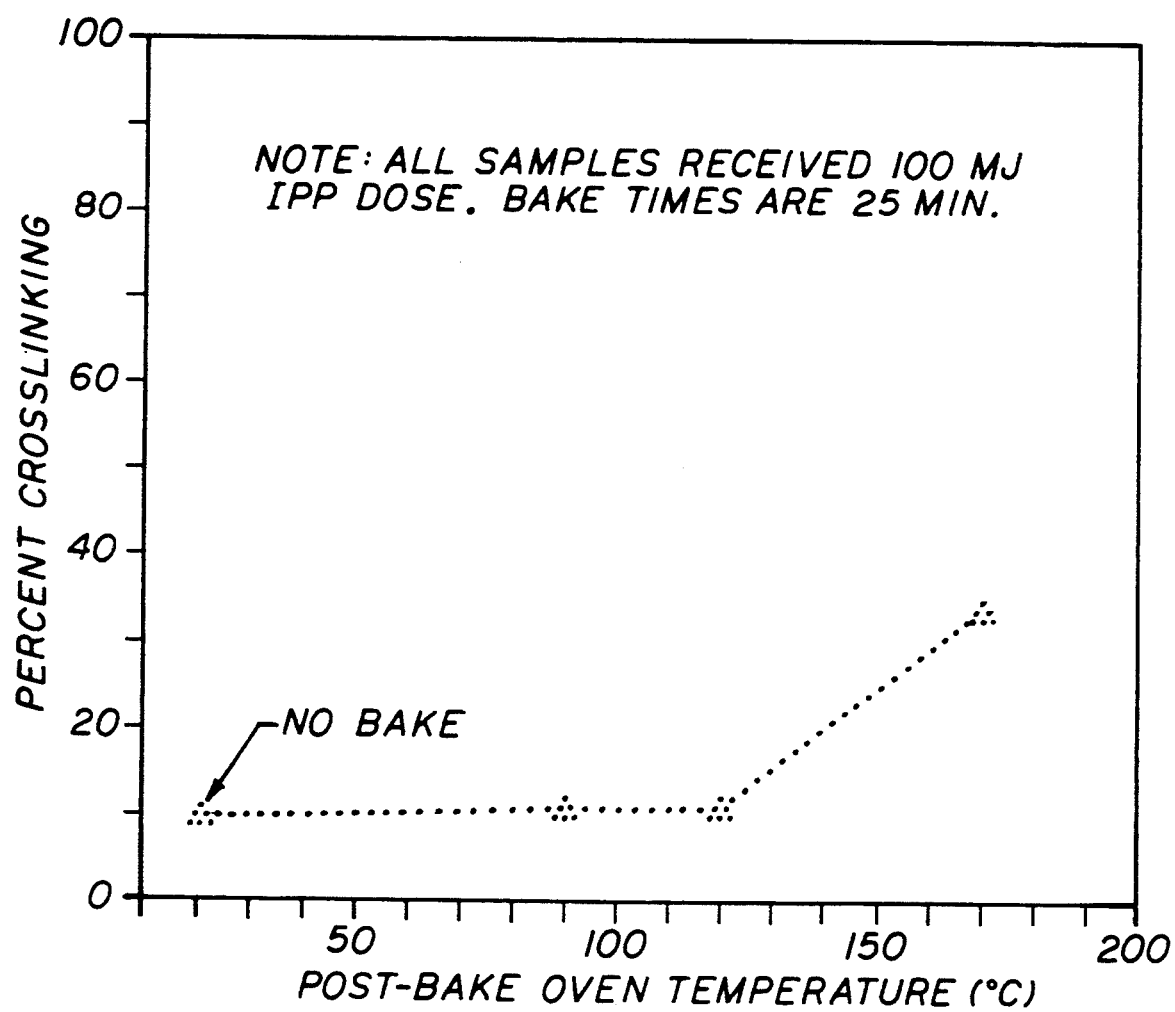
FIG. 13 is a graph of photoresist curing as a function of oven-bake temperature.

The effect of a convection oven bake alone on curing of the NT90 is shown in FIG. 13. Bakes for 30 minutes at temperatures 90°–120° C. did not increase the percent of curing. At 170° C. for 25 minutes there was an increase of about 24%, but this is small compared to the greater than 50% curing produced in less than 1 minute by a UV bump. Moreover, photoresist films which were exposed to only a 90°–170° C. convection oven bake are attacked quickly by permanganate etchant, presumably because little or no curing occurred. Those photoresist films that were exposed to 190° and 210° C. convection oven bakes, while they resisted the permanganate etchant, were not strippable according to the present invention. Thus, the convection oven bake without the UV bump is not within the scope of the invention.

Figure 15:
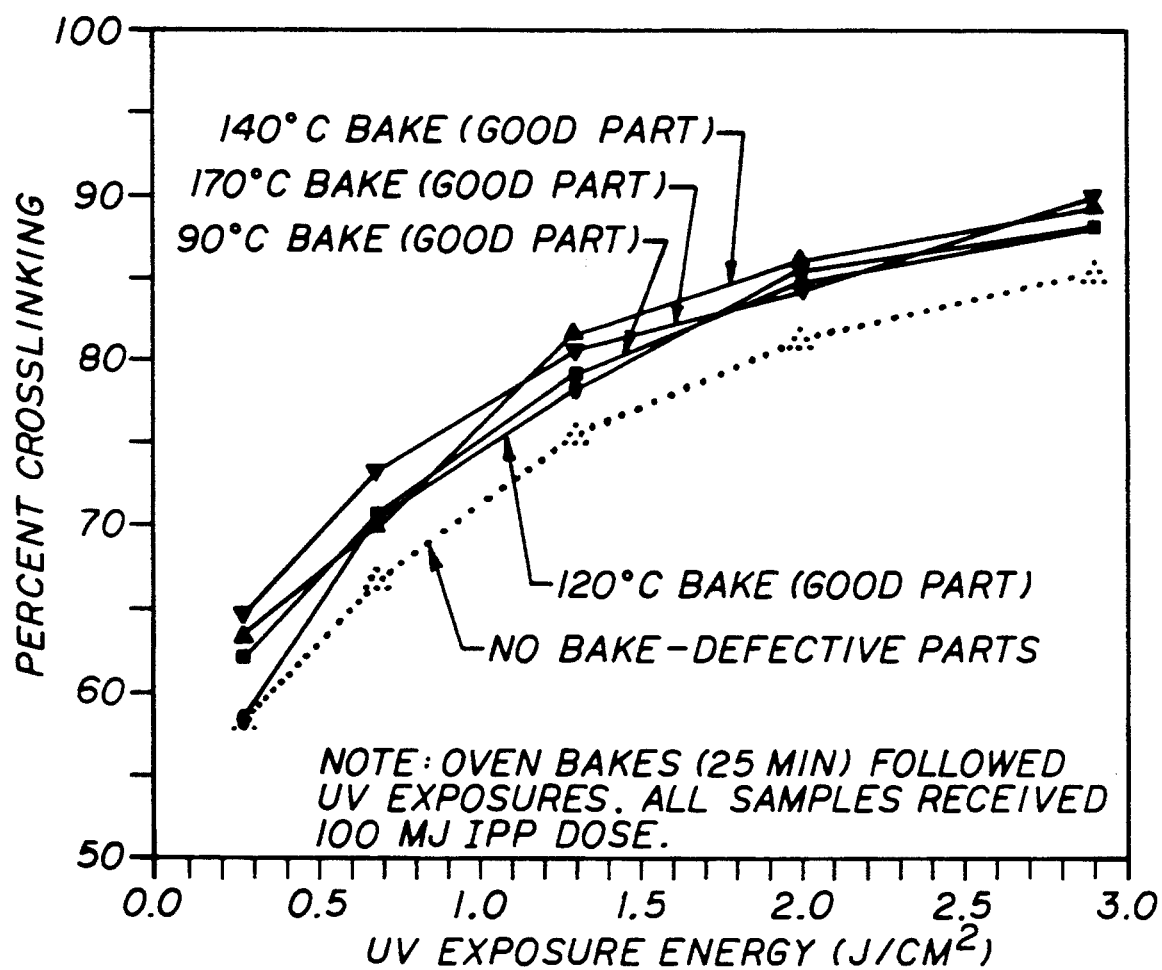
FIG. 15 is an expanded plot of FIG. 14 showing curing of photoresist as a function of UV dose and convection oven-bake temperature. The following symbols correspond to the following bake temperature: ▲:140° C.; ▼ :170° C.; ■:90° C.; ●:120° C.; and ∴: no bake. Those parts which did not receive any UV bump were defective.
Figure 16:
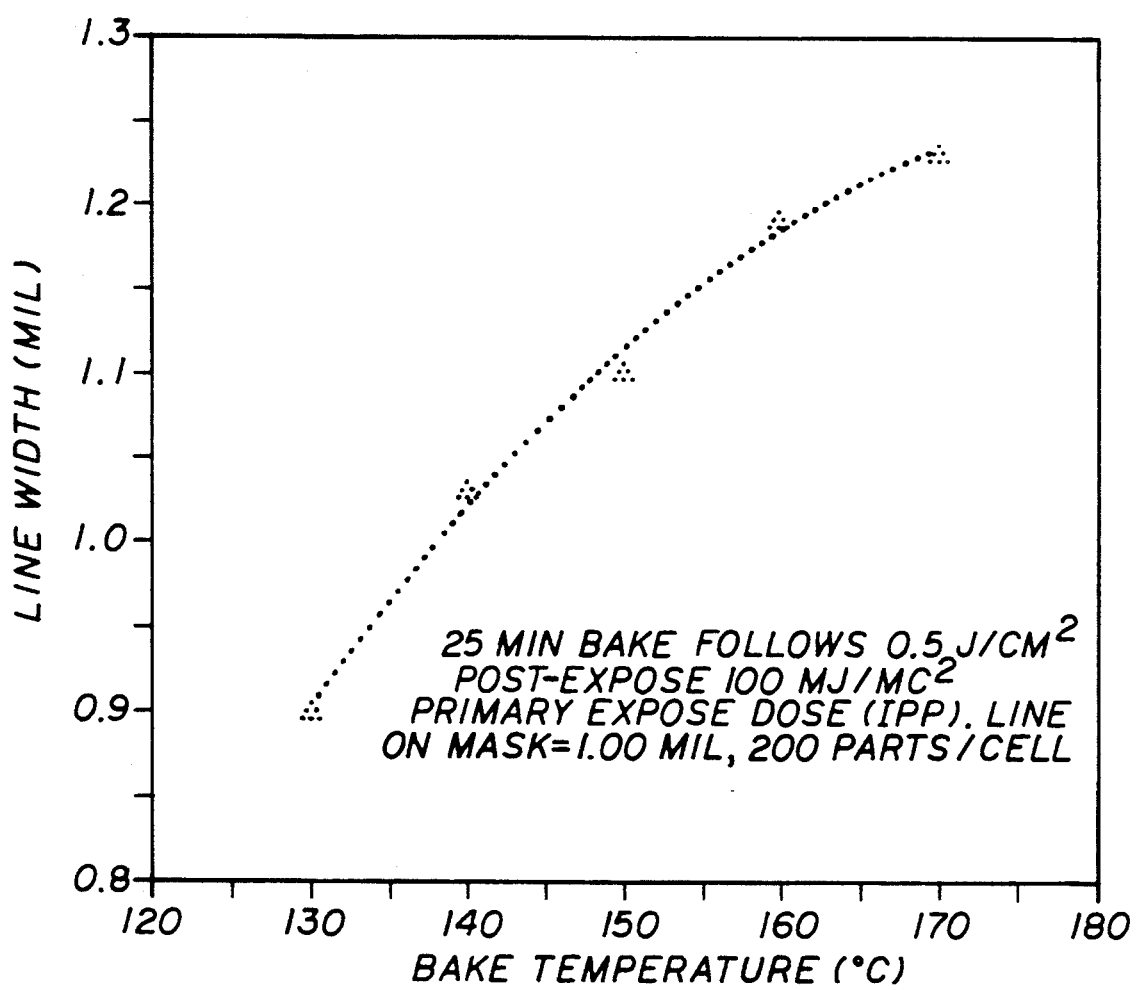
FIG. 16 is a graph of line width as a function of bake temperature.

FIGS. 14 and 15 present plots of percent of curing versus UV bump energy for different convection oven bake temperatures. The parts were first UV bumped then oven baked for 25 minutes. As expected from the data of FIG. 13, for parts receiving a UV bump, there is little difference in percent of curing between no bake at all and bakes in the 90°–170° C. range.

There is even less of a difference in the values for the various temperatures at any given UV energy, as shown in the expanded plot of FIG. 15. Acceptable parts were obtained by the UV bump followed by a bake step. However, defective parts were produced by the UV bump only, although the percent of curing for the UV bump alone is higher than some percent of curing for parts receiving a UV bump followed by a bake.

The UV bump increases the percent of curing of the photoresist thereby rendering the photoresist resistant to the permanganate etchant. The bake step is thought to increase adhesion of the photoresist, thereby preventing undercutting by permanganate etchant and the consequent defects.

For an IR bake alone of 6 minutes, curing is believed to occur at high temperatures, that is, at 190° C. or above, and at such temperatures the photoresist flows slightly near the substrate interface. As a result of the flow, good adhesion is maintained. This differs from the rapid cure induced by the UV bump, below 80° C. which may give rise to mechanical stresses as a result of shrinkage upon further polymerization.

Stripping the Photoresist

Parts exposed to 1 J/cm² UV light followed by IR exposure for 1 minute at either 85° C., 203° C., or 300° C. were evaluated for photoresist strippability.

Also, parts at different stages of manufacturing were evaluated for strippability. Photoresist coated parts that were exposed, developed, then subjected to the permanganate etchant, then the iron chloride etchant, and then the permanganate etchant, and then stripped, are referred to as "first pass" parts. "Second pass" parts are first pass parts which have been further coated with about 14 μm of photoresist, exposed, through a phototool to reveal a pattern different from the first pass parts, developed, subjected to the permanganate etchant, and stripped. Several different stripping agents were also evaluated.

First and second pass parts were immersed in various water dilutions Shipley XP6504, which contains lactic acid, surfactant and water, and at various temperatures up to 80° C. No stripping was observed for immersion times as long as ten minutes. Identical results were obtained for Shipley XP8907, a developer concentrate containing lactic acid and surfactant.

First and second pass parts were exposed to a stripping agent composed of Shipley XP-8985-1, which contains 38% butyl cellosolve and 13% n-butyl alcohol and 25% of an organic acid. After extended immersion times at elevated temperatures, for example, 15 minutes at 80° C., the XP-8985-1 partially stripped the parts.

A variety of organic solvents were evaluated as stripping agents: acetone, methyl ethyl ketone, toluene, hexane, benzyl alcohol, ethanol, methanol, dimethyl formamide, tetrahydrofuran, g-butyrolactone, propylene carbonate, butyl cellosolve, and diethylene glycol dimethyl ether, all without success. While room temperature methylene chloride, a conventional stripping agent, worked, it is a halogenated solvent that is not within the scope of the invention.

N-methyl pyrrolidone (NMP) at 60° C. and higher temperatures partially stripped the photoresist upon a 5 minute immersion. When the parts were ultrasonically vibrated, stripping was complete within five minutes at 65° C. The photoresist "flaked off" as opposed to dissolving. However, the NMP effectively stripped parts that were not too highly cured. That is, parts that received a UV bump of 1 J/cm² and an IR post bake, of 1 minute at 85° C. were strippable; parts subjected to higher curing conditions involving an IR bake at 203° C. or 300° C. were not even partially stripped.

Using concentrated lactic acid (85%) as a stripping agent gave virtually identical results as for the NMP.

The Hubbard-Hall Resist Stripper #17, also available from Shipley as XP9017, which contains about 55% butyl cellosolve, about 40% monoethanolamine, and about 5% sodium hydroxide, stripped the photoresist. A water to stripping agent concentrate ratio of 1:7 and a temperature of 72° C. are preferred. Stripping of even a highly cured, that is greater than 80% cured, 12 μm photoresist coated parts was complete upon a 4.5 minute immersion, without agitation, followed by a warm water rinse. However, the 1 to 7 water ratio XP9017 has several drawbacks: it causes copper oxidation, particularly at temperatures greater than 72° C.; it has relatively low-flash point of about 73° C.; it has relatively long-strip time as compared to the normal KTFR process; it leaves small but significant amounts of photoresist residue on ceramic; and it has a small process window; at temperatures less than 72° C. the strip time greatly increases, and at temperatures greater than 72° C. the copper oxidation becomes a problem.

A suitable stripping agent was finally identified that did not have such drawbacks. This material is available under the designation ACT-140, manufactured by Advanced Chemical Technologies of Allentown, Pa. While the precise formulation of ACT-140 is proprietary, ACT-140, has a pH of 12–13 and is composed of about 10% KOH, water, alcohols and glycol ethers. After a three minute immersion at 83° C. the first or second pass parts were completely stripped; the residues on ceramic were less than or equal to that observed, using a fluorescent microscope, with the KTFR process. Neither copper oxidation nor phase separation is a problem, and the material presents no special toxicity problems. It is free of halogenated solvents, and shows promise for waste disposal by bio-treatment.

The preferred stripping method which completely removes the photoresists, involves immersing the cured photoresist coated parts in baths of ACT-140, deionized water and isopropyl alcohol. The panels were immersed in 6 baths of the following composition and temperature: ACT-140 at 83° C. (±3°); ACT-140 at 83° C. (±3°); deionized water at 65° C. (±5°); deionized water at ambient temperature; isopropyl alcohol at ambient temperature; and isopropyl alcohol at ambient temperature. The immersion time in each bath was 90 seconds and the time between each bath was 20 seconds.

Using only deionized water as a rinse agent, as recommended by ACT the manufacturer, left small amounts of photoresist residue on the parts which was visible under a fluorescent microscope at a magnification of a 100×. When the deionized water rinse was followed by an isopropyl alcohol rinse, the residue was removed.

Good results were also obtained using diethylene glycol monobutyl ether, at ambient temperature, in bath 3 and 4 followed by deionized water at ambient temperature, in bath 5 and 6.

Figure 17:
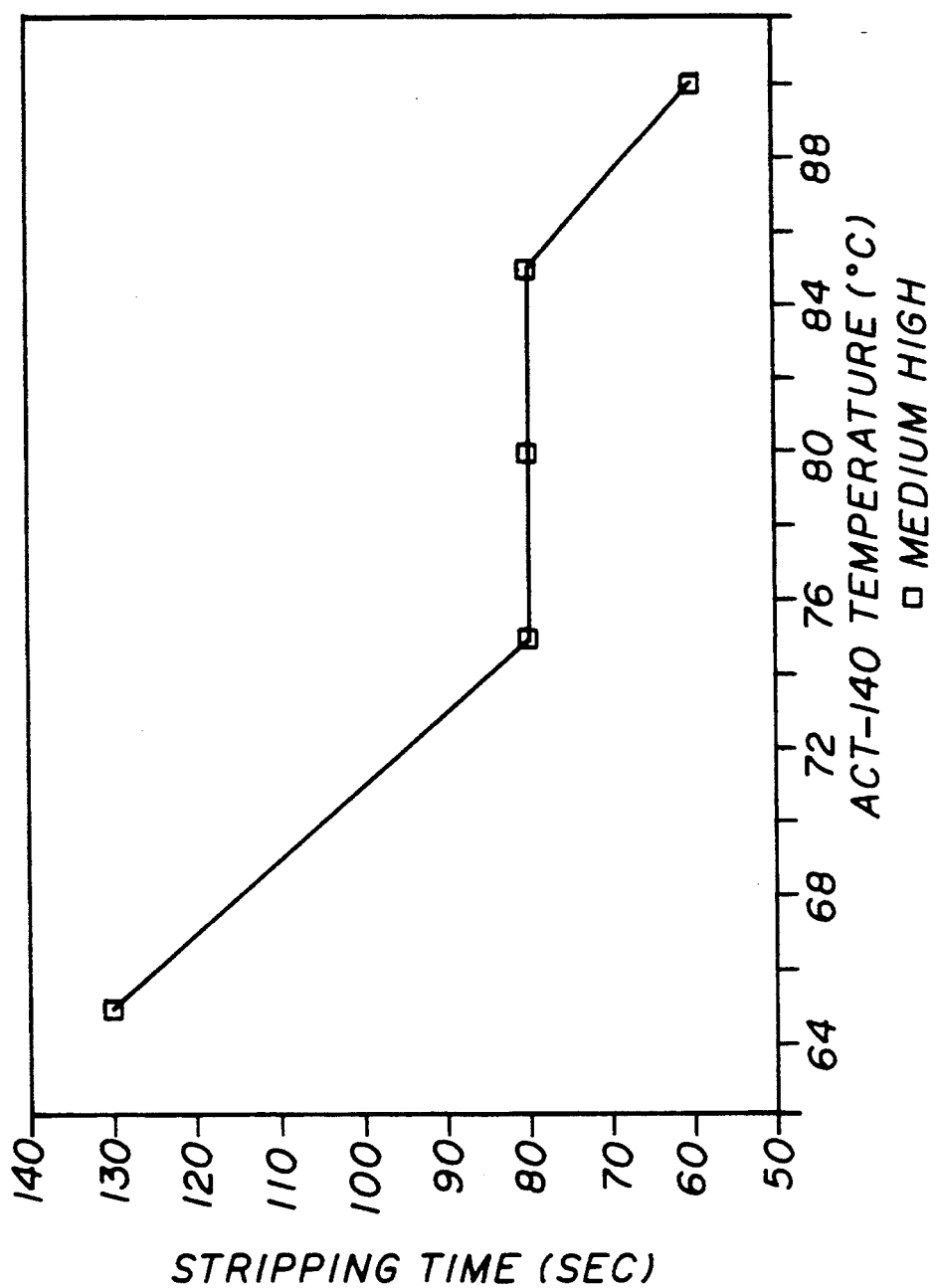
FIG. 17 is a graph of the photoresist stripping time v. stripping agent temperature for first pass parts, which received a 1 joule/cm² UV bump followed by a 1 minute IR exposure at temperature between 203°–300° C.
Figure 18:
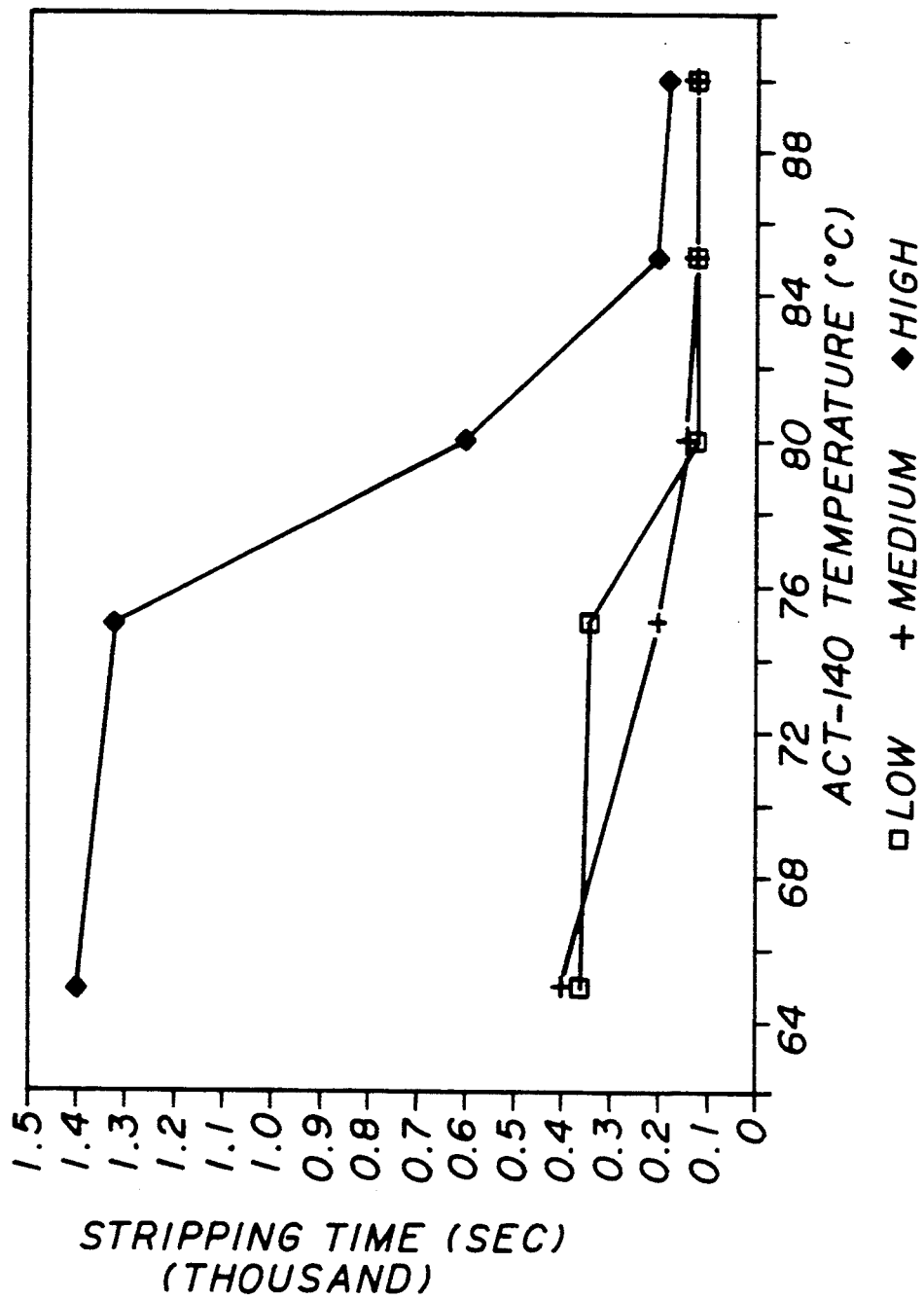
FIG. 18 is a graph of the photoresist stripping time v. stripping agent temperature for second pass parts, which received a 1 joule/cm² UV bump followed by a 1 minute IR exposure. The following symbols correspond to the following bake temperature: □:80° C.; +:203° C.; and ◆:300° C.

FIGS. 17 and 18 show that cured photoresist is quickly stripped in the ACT-140 at temperatures over 80° C., although second pass parts that are highly cured are especially difficult to strip. First pass parts are much easier to strip than the second pass parts. The difficulty in stripping second pass parts is also observed for the KTFR photoresist coated parts using other stripping agents.

However, since second pass parts do not require IR temperatures above 210° C., stripping should be complete if the temperature of the ACT-140 is kept between 80° and 85° C. and the stripping time is greater than 180 seconds.

Although one embodiment of this invention has been shown and described, various adaptations and modifications can be made without departing from the scope of the invention as defined in the appended claims.

What we claim is:

1. A method for selectively etching metal from a substrate comprising of steps of:
    A. providing an acrylic negative photoresist;
    B. applying the photoresist to the substrate;
    C. then imaging the photoresist;
    D. then developing the photoresist;
    E. then exposing the photoresist to actinic radiation comprising wavelengths selected from the group consisting of: about 200 to 310 nm; or about 2.4 to about 8 microns;
    F. then contacting the photoresist coated substrate with an etchant so as to remove portions of the metal not covered by the photoresist.

2. The method of claim 1, wherein the metal is chromium.

3. The method of claim 1, wherein the etchant is alkaline potassium permanganate.

4. The method of claim 1, wherein the actinic radiation comprises wavelengths of about 200 to 310 nm.

5. The method of claim 4, wherein the metal is chromium and the etchant is alkaline potassium permanganate.

6. The method of claim 4, wherein the actinic radiation comprises wavelengths of about 254 nm.

7. The method of claim 1, wherein the radiation has a wavelength of about 2.4 to about 8 microns.

8. The method of claim 7, wherein the metal is chromium and the etchant is alkaline potassium permanganate.

9. The method of claim 4, further comprising the step of baking the photoresist after step e.

10. The method of claim 9, wherein the baking is accomplished by convection heating.

11. The method of claim 11, wherein the metal is chromium and the etchant is alkaline potassium permanganate.

12. The method of claim 9, whenever the baking is accomplished by exposure to infrared radiation.

13. The method of claim 12, wherein the metal is chromium and the etchant is alkaline potassium permanganate.

14. The method of claim 1, further comprising the step of stripping the photoresist after step f.

15. The method of claim 14, wherein the developing and stripping is accomplished with reagents essentially free of halocarbons.

16. The method of claim 15, wherein the stripping reagent is comprised of: hydroxide; alcohol; glycol ether; and water.

17. The method of claim 15, wherein the stripping reagent is comprised of: hydroxide; monoethanolamine; and butyl cellosolve.

18. The method of claim 15, wherein the stripping reagent is comprised of n-methyl pyrrolidone.

19. The method of claim 15, wherein the stripping reagent is comprised of lactic acid.

* * * * *